United States Patent Office 3,637,644

Patented Jan. 25, 1972

3,637,644

AZONIA DIAZO KETONES

Kenneth R. Dunham, Donald L. Fields, Douglas G. Borden, and Jerry B. Miller, Rochester, N.Y., assignors to Eastman Kodak Company, Rochester, N.Y.

No Drawing. Original application Mar. 8, 1967, Ser. No. 621,469, now Patent No. 3,526,503, dated Sept. 1, 1970. Divided and this application Nov. 13, 1969, Ser. No. 871,287

Int. Cl. C07c *113/04;* G03c *1/54*

U.S. Cl. 260—141 8 Claims

ABSTRACT OF THE DISCLOSURE

This invention concerns azonia diazo ketones having the following structure:

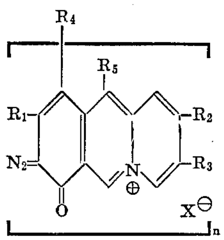

wherein $X^{\ominus}$ represents an anion such as a halide ion, a perchlorate ion, a tetrafluoroborate ion, or the like, *n* is a whole integer 1 or 2; $R_1$ and $R_2$ each represents a hydrogen atom, an alkyl (e.g. 1–8 carbon atoms), aralkyl, cycloalkyl, alkoxy or aryl group, said group optionally containing hetero atoms, or said group being optionally substituted; $R_3$ represents a hydrogen atom or the atoms necessary to complete an aromatic carbocyclic ring with $R_2$, said ring being optionally substituted; $R_5$ represents a hydrogen atom, alkyl groups or phenyl groups optionally substituted; and $R_4$, when $n=2$, represents an alkylene group or chemical bond and, when $n=1$, $R_4$ represents a hydrogen atom, an alkyl group (e.g. 1–8 carbon atoms), or an aryl group, and the use of these ketones in photoresist compositions and in lithography.

This a division of U.S. patent application Ser. No. 621,-469, Photoresist Composition, filed Mar. 8, 1967, now U.S. Pat. 3,526,503 issued Sept. 1, 1970.

This invention concerns new diazo light sensitive materials and their use in photographic processes. In one aspect, it relates to new azonia diazo ketones and to their use as print-out materials, as photographic resist compositions and light sensitive materials on lithographic printing plates.

It is well known in the photographic art to employ diazo ketones, of the benzene and naphthalene series as light sensitive materials. Certain of these materials have been useful as positive working materials for use in photoresist systems. Many of these known materials include structural addition to naphthoquinone diazide sulfonic esters.

The diazo ketones of the benzene and naphthalene series have also been known for use in the preparation of lithographic plates. In the use of both the photoresist compositions and lithographic plates, exposure to actinic rays results in decomposition of the diazo compound to yield substances which differ in solubility from the unexposed materials.

By the choice of solvents, it is often possible to remove either the light decomposition products or the unexposed diazo ketones. In one embodiment, the light decomposition products are removed by solution in dilute alkalis in which the parent diazo compounds are not soluble. This alkali solubility of the light degradation products has been explained by the premise that under the influence of light, the diazo ketones decompose to form compounds which contain functional groups which are readily hydrolyzed to form carboxyl groups. The images thus obtained are duplicates of the pattern through which the plate was exposed, e.g., a positive image is obtained from a positive pattern and a negative image from a negative pattern; such plates and processes are termed "positive working." Many of the same plates may be made "negative working," that is, positive printing plates may be obtained from negative patterns and vice versa, by developing the plates, after exposure, with organic solvents which selectively dissolve the parent diazo compound but not the light degradation products. In both cases, the developed plate is then prepared for use on the printing press by rubbing greasy ink into the image with or without prior or subsequent treatments well known in the art.

In many cases, the diazo ketones are coated on a lithographic support material, e.g., a zinc, aluminum, or specially prepared paper support material, along with an alkali soluble resinous material to obtain a more uniform coating with better adhesion to the support and with less tendency to crystallize or become brittle. When such resins are employed, consideration is given to the fact that diazo ketones are known to insolubilize many resins when exposed to light in their presence.

Typical diazo ketone resins need to be treated with a colorant after exposure and processing to satisfactorily differentiate the image area. Therefore, it has been desirable to have a diazo ketone which would have a differentiating color.

We have now discovered new diazo ketones which form colored print-out images on exposure to light and which can be used to form photoresists and both negative and positive working lithographic plates.

It is an object of this invention to provide new diazo ketones which are sensitive to actinic rays. Another object is to provide new print-out materials. Still another object is to provide negative and positive photoresist compositions with print-out or bleach-out characteristics. It is a further object to provide new photographic elements useful for preparing negative and positive working lithographic printing plates by photochemical methods. A still further object is to provide light sensitive film-forming material sensitized by new diazo ketones to provide print-out characteristics. It is still another object to provide new photographic elements which produce intensely colored print-out images on exposure to light. Other objects will be apparent from the following disclosure:

These and other objects are accomplished through the preparation and use of diazo ketones derived from certain azonia-anthracene salts which are distinguished from diazo ketones, of the prior art in that they afford intensely colored alkali insoluble materials on exposure to light, in contrast to conventional diazo ketones which afford light decomposition products which are essentially colorless or only faintly colored and which are soluble in aqueous alkalis.

The novel diazo ketones of our invention correspond to Formula 1 as follows:

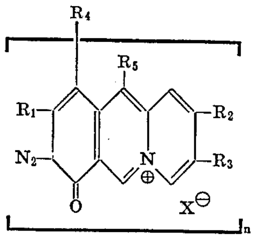

wherein $X^{\ominus}$ represents an anion such as, for example, a halide ion, a perchlorate ion, a tetrafluoroborate ion, etc.; *n* is a whole integer 1 or 2; each $R_2$ and $R_3$ is selected from the group consisting of hydrogen atoms, straight or branched chain alkyl groups having 1 to 8 carbon atoms, for example, methyl, ethyl, isopentyl, etc., aryl groups such as, for example, phenyl, naphthyl, etc., aralkyl groups such as, for example, benzyl, etc., cycloalkyl groups such as, for example, cyclopentyl, cyclohexyl, etc. and alkoxy groups having 1 to 4 carbon atoms, for example, methoxy, etc.; said alkyl, aryl, aralkyl and cycloalkyl groups optionally containing hetero atoms, such as, for example, nitrogen, oxygen, sulfur, etc. and said alkyl, aryl, aralkyl and cycloalkyl groups being optionally substituted with halogen atoms, lower alkyl, aryl, nitro, sulfonic acid, hydroxy, carboxy, amido, carbalkoxy, e.g. carbethoxy, etc., alkoxy, e.g. methoxy, etc.; alkylamido, e.g. N-ethylamido, etc., dialkylamido, e.g. N,N-diethylamido, etc., and dialkylamino, e.g. N,N-diethylamino, etc., groups wherein each alkyl portion of said carbalkoxy, alkoxy, alkylamido, dialkylamido and dialkylamino groups contains 1 to 4 carbon atoms and $R_2$ and $R_3$ may be taken together to represent the atoms necessary to complete a fused aromatic mono- or polycyclic ring system, said cyclic ring system being optionally substituted with any of the groups specified for $R_2$ and $R_3$ taken separately, $R_1$ is selected from the group consisting of halogen atoms, nitro, sulfonic acid, carboxy, amido, carbalkoxy, alkoxy, alkylamido, dialkylamido, dialkylamino and the groups specified for $R_2$ and $R_3$ when $R_2$ and $R_3$ are taken separately, each alkyl portion of said carbalkoxy, alkoxy, alkylamido, dialkylamido, and dialkylamino groups containing 1 to 4 carbon atoms; $R_5$ is selected from the group consisting of hydrogen atoms, alkyl groups of 1 to 4 carbon atoms, and substituted or unsubstituted phenyl groups such as, for example, tolyl, halophenyl, nitrophenyl, etc.; $R_4$, when $n$ is 1, is selected from the group specified for $R_1$, and $R_4$, when $n$ is 2, is an alkylene chain of 1 to 4 carbon atoms, e.g. methylene, etc., or a chemical bond.

These novel diazo ketones, wherein $n=1$, may advantageously be prepared by the sequence of reactions indicated in Eq. 1, wherein $R_1$, $R_2$, $R_3$, $R_4$ and $R_5$ are as defined hereinabove, when $n=1$ and $R_6$ is a lower acyl group such as an acetyl group.

Equation 1

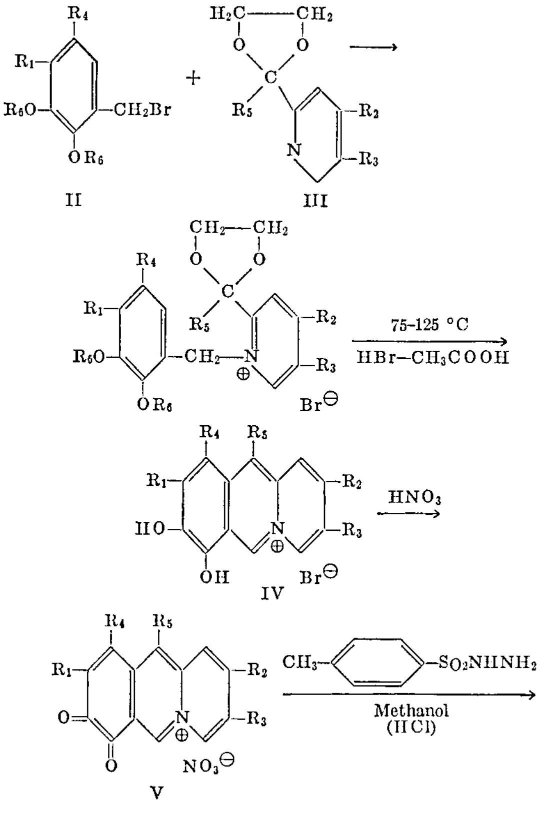

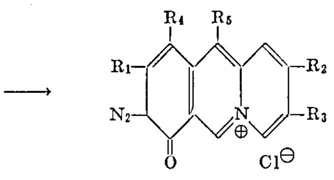

The preparations of the intermediates employed in this reaction sequence and the intermediate steps in the reaction sequence are known in the art and need not be described in detail. The catechol derivatives (II), for example, may be prepared by the method of Fields et al., J. Org. Chem., 29, 2640 (1964), and the diols (IV) by the method of Fields et al., J. Org. Chem., 30, 252 (1965). Bradscher et al. in J. Org. Chem., 29, 61 (1964), discloses 2-(1,3-dioxolan-2-yl) pyridine (III). The oxidation of (IV) to (V) is effected conventionally by well known means, and the conversion of V to the corresponding diazo ketones is effected by a modification of the method of M. Cava et al., J. Am. Chem. Soc., 80, 2262 (1958).

The novel diazo ketones of our invention corresponding to Formula 1 wherein $n=2$ and $X^{\ominus}$, $R_1$, $R_2$, $R_3$, $R_4$ and $R_5$ having their hereinabove indicated meanings are advantageously prepared by treating the diol (IV) of Eq. 1, wherein $R_4$=H and $R_1$, $R_2$ $R_3$ and $R_5$ have the same meaning as above, with an N-alkoxymethyl-N,N-dialkylamine of the type known to react with phenols to obtain the corresponding 8,8'-methylene-bis-(5,6-dihydroxy-4a- azonia-anthracene bromides) and subsequently converting the latter to the corresponding 8,8'-methylene-bis-(6-diazo-5-oxo-4a-azonia-anthracene salts) by the same methods as those described above for the preparation of the diazo ketones of our invention corresponding to Formula 1 wherein $n=1$, and $X^{\ominus}$, $R_1$, $R_2$, $R_3$, $R_4$ and $R_5$ have their indicated meanings.

In one embodiment of our invention, at least one of the diazo ketones of our invention is applied from solution to one of a variety of substrates upon which it is desired to record an image. Such supports include cloth, paper, ceramics, rubber, wood, metals, plastic films, and the like. The desired print-out image is then produced by exposure to a pattern of actinic radiation, such as a pattern of ultraviolet light, and may be used as such if only a temporary record is desired or, if a permanent record is desired, the unexposed materials may be removed by treatment with an appropriate solvent.

A particularly useful application of this embodiment of our invention is in the formation of visible images in association with other light sensitive materials such as light sensitive resins and the like, said images being useful for registration purposes, for inspection purposes, as actinometer for determining when a layer has received a proper degree of exposure, etc. These images may be formed within the other light sensitive layers or contiguous thereto. It is particularly advantageous to employ our diazo ketones in this application in association with light sensitive resins which are insolubilized by actinic radiation since our diazo ketones do not normally exhibit adverse effects on such resins such as desensitization, but instead, tend to render such resins with which they are associated less soluble after exposure to actinic radiation. It will be appreciated by those skilled in the art that this application will be of great utility with materials and supports which are light in color so that high contrast between exposed and unexposed areas is obtained. Dark colored materials and supports may also be employed if the attendant decrease in contrast can be tolerated.

In another embodiment of our invention, a photoresist composition is prepared employing at least one azonia diazo ketone mixed with a film-forming resin. For instance, the film-forming resin may be a phenol formaldehyde resin such as those known as novolak or resole resins ("Hackh's Chemical Dictionary" by Grant, 3rd Edition, 1944, McGraw-Hill, New York, N.Y.), which form a reaction product with the azonia compound. In a particularly useful system, an alkali soluble phenol formaldehyde resin is used with the azonia compound to form a complex or a reaction product which is insoluble in alkali but which forms decomposition products upon exposure to actinic rays which are soluble in dilute alkali. The term "reaction product" is intended to include a complex or other association product. In a particularly useful embodiment, the weight ratio of azonia diazo ketone to resin is between 1:1.5 to 1:20 and results in especially good performance at a weight ratio of 1:5 to 1:10. The amount of alkali and strength needed to process the exposed resist depends upon the ratio of azonia to resin. The alkali solution may range in strength up to that of 5% aqueous sodium hydroxide.

The azonia diazo ketone compounds may be mixed in any proportion with a film-forming material to form resists or print-out materials. When the azonia diazo ketone material is mixed with a light sensitive resin, it may be used to increase the sensitivity to actinic rays of the resulting composition and may also provide print-out characteristics. For instance, a very small amount may be used with a light sensitive polycarbonate resin for this purpose. In other embodiments for preparing photoresists, the azonia diazo ketone compound may be combined with film-forming resins in amounts up to 50% or more of the total composition by weight, solids basis, and processed in solvents which dissolve the unexposed areas leaving the exposed areas on the support. In these systems, negative working photoresists are provided.

It will be appreciated that the photoresist compositions can be provided in a dry form to be mixed with a suitable solvent. However, a particularly suitable way of providing the photoresist is in a solvent solution using one or more volatile organic solvents which are solvents for both the resinous material and the azonia material. The solution can be used as provided or can be further diluted depending upon the purpose for which it is to be used.

The photoresist solution may be applied to a clean surface by spraying, dipping, whirling, etc. and air dried. If desired, a prebake of 10 to 15 minutes at 60° C. is given to remove residual solvent and the coating is exposed through a pattern to a light source such as a carbon arc. The resist coating, if positive acting, is then placed in a developer solvent such as an aqueous alkaline developer, to remove the exposed areas. The alkaline strength of the developer, as well as the presence of addenda such as solvents, is governed by the particular diazo ketone used, the anion present, the resin employed and the ratio of the azonia diazo ketone to resin. The developer may also contain dyes and hardening agents. The developed image is rinsed with distilled water, dried and optionally postbaked for 15 to 30 minutes at 60 to 80° C. The substrate can then be etched by acid etching solutions such as ferric chloride.

In another embodiment of our invention, a solution containing at least one of the diazo ketones of our invention is coated upon a lithographic support material by one of the conventional techniques such as whirl coating, flow coating, dip coating, hopper coating, etc. and allowed to dry. The resulting photographic element is then exposed through a negative pattern to actinic radiation such as that from an ultraviolet light source and subsequently developed with a solvent for the unexposed portions of the light sensitive coating to obtain a positive, highly colored, oleophilic image suitable for use in lithographic printing.

The lithographic support materials which are useful in this embodiment of our invention may be selected from any of those well known in the art such as zinc, anodized aluminum, grained aluminum, copper and specially prepared metal and paper supports; superficially hydrolyzed cellulose ester films; polymeric supports such as polyolefins, polyesters, polyamide, etc.

The solvents which may be employed as coating solvents for the light sensitive materials of our invention are preferably organic solvents which may be selected from those which are capable of dissolving at least 0.2% by weight of the light sensitive materials employed but are unreactive toward the light sensitive materials and which are substantially incapable of attaching the substrates employed. Exemplary solvents include dimethylformamide, cyclohexanone, acetonitrile, 2-ethoxyethanol and mixtures of these solvents with each other or with one or more of the lower alcohols and ketones.

It will be appreciated by those skilled in the art that it can be advantageous to include in the coating solutions materials which may serve to improve film formation, coating properties, adhesion of the coatings to the supports employed, mechanical strength, etc. Exemplary materials include resins, stabilizers and surface active agents. When resins are employed, they are usually selected from those which are soluble in both the coating and developing solvents, although minor proportions of resins which are insoluble in the development solvents may also be included. The amounts of resins soluble in both the coating and developing solvents which are employed will vary with the particular combination of resin and light sensitive material employed. In general, particularly useful results are obtained with coatings containing from 0.1 to 50 parts by weight of resin per part of light sensitive material.

The concentrations of the coating solutions are dependent upon the nature of the light sensitive materials, the supports and the coating methods employed. Particularly useful coatings are obtained when the coating solutions contain 0.05 to 3 parts by weight, and preferably from 0.5 to 2 parts by weight, of light sensitive material. Higher concentrations than 3 percent, of course, give satisfactory results.

When the azonia diazo ketones of our invention are incorporated in light sensitive resins, the amount of azonia diazo ketone to the light sensitive resin may be extremely small and depends upon the nature of the light sensitive resin as well as upon the particular azonia diazo ketone employed. For instance, when the azonia diazo ketone is used with a light sensitive polycarbonate, one part azonia diazo ketone may be employed with four parts of the polycarbonate. It will be appreciated, however, that one part of the azonia diazo ketone might be used with from 50 to 100 parts of a light sensitive resin.

As pointed out above, phenol formaldehyde resins are particularly useful for incorporation in light sensitive coatings containing the azonia diazo ketone defined herein. These phenol formaldehyde resins include those which have been recognized as novolak resins.

The novolak resins are prepared by the condensation of phenols and aldehydes under acidic conditions. Less than 6 moles of formaldehyde are used per 7 moles of phenol to provide products which are permanently fusible and soluble. In a typical synthesis, novolaks are prepared by heating 1 mole of phenol with 0.5 mole of formaldehyde under acidic conditions. The temperatures at which the reaction is conducted are generally from about 25° C. to about 175° C.

The novolak resins are prepared by the condensation of phenol with formaldehyde, more generally by the reaction of a phenolic compound having two or three reactive aromatic ring hydrogen positions with an aldehyde or aldehyde-liberating compound capable of undergoing phenol-aldehyde condensation. Illustrative of particularly useful phenolic compounds are cresol, xylenol, ethylphenol, isopropylmethoxyphenol, chlorophenol, resorcinol, hydroquinone, naphthol, 2,2-bis(p-hydroxyphenyl) propane and the like.

Illustrative of especially efficacious aldehydes are formaldehyde, acetaldehyde, acrolein, crotonaldehyde, furfural, and the like. Illustrative of aldehyde-liberating compounds are 1,3,5-trioxane, etc. Ketones such as acetone are also capable of condensing with the phenolic compounds.

The most suitable novolak resins are those which are insoluble in water and trichloroethylene but readily soluble in conventional organic solvents such as methyl ethyl ketone, acetone, methanol, ethanol, etc. Novolak resins having a particularly desirable combination of properties are those which have an average molecular weight in the range between about 350 and 40,000.

It is to be understood that the term novolak resins as used herein, indicates those resins which can be incorporated with the light sensitive polymers; those novolak resins which can be used are those which are either heat fusible or solvent soluble, which permit admixture and association.

The photographic elements employed in this embodiment of our invention are exposed by conventional methods to a source of actinic radiation which is preferably an ultraviolet light source. The exposed elements are then developed by flushing, soaking, swabbing, or otherwise treating the light sensitive layers with a solvent or solvent system which exhibits a differential solvent action on the exposed and unexposed materials preferentially removing the materials which have not been modified by the action of actinic radiation. These developing solvents may be organic or aqueous in nature and will vary with the composition of the photographic layer to be developed. Exemplary solvents include water, aqueous acids and alkalis, the lower alcohols and ketones, and aqueous solutions of the lower alcohols and ketones. The resulting images may then be treated in any known manner consistent with their intended use such as treatment with desensitizing etches, plate lacquers, etc.

The following examples are intended to illustrate our inventions but not to limit it in any way:

Example 1.—Preparation of 6-diazo-5-oxo-8-phenyl-4a-azoniaanthracene tetrafluoroborate A total of 100 g. of 5,6-dihydroxy-8-phenyl-4a-azoniaanthracene bromide was added in portions over a 15-minute period to a stirred mixture of 200 g. of ice and 200 ml. of concentrated nitric acid. Ethanol (300 ml.) was then added and stirring was continued for about 10 minutes. The precipitate was then collected to obtain a substantially quantitative yield of 8-phenyl-4a-azoniaanthracene-5,6-dione nitrate.

A mixture of 8-phenyl-4a-azoniaanthracene-5,6-dione nitrate (34.8 g.) and p-toluenesulfonylhydrazide (25 g.) was dissolved in 100 ml. of methanol which had been saturated with hydrogen chloride. After standing at autogenous temperature for 15 minutes, the red solution was diluted with 200 ml. of water and 50 ml. of 50% fluoroboric acid. A yellow crystalline product (26.1 g., 68%) immediately separated and was collected after refrigerating the reaction mixture for 2 hours at −20° C. An analytical sample was recrystallized from acetonitrile-diethyl ether.

*Analysis.*—Calcd. for $C_{19}H_{12}BF_4N_3O_2$ (percent): C, 59.3; H, 3.1; F, 19.8; N, 10.9. Found (percent): C, 59.6; H, 3.5; E, 19.8; N, 10.8.

Example 2.—Preparation of 8-tert-butyl-6-diazo-5-oxo-4a-azoniaanthracene salts 8-tert-butyl-5,6-dihydroxy - 4a - azoniaanthracene bromide (575 g., 1.4 moles) was added in portions over a 15 minute period to a stirred mixture of 600 ml. of concentrated nitric acid and 300 g. of ice, the reaction temperature being maintained at 5–15° C. by additions of ice. The resulting mixture was diluted with ice-water to a volume of 4 liters and the precipitated quinone (296 g., 60%), M.P. 250° (dec.), collected and dried.

A mechanically stirred mixture of 353 g. (1 mole) of the above quinone and 241 g. (1.3 moles) of p-toluenesulfonylhydrazide in 750 ml. of methanol was treated with 300 ml. of concentrated hydrochloric acid. After stirring at autogenous temperature for 15 minutes, the solution was diluted with 200 ml. of ethanol followed by 4 liters of ether. The desired 8-tert-butyl-6-diazo-5-oxo-4a-azoniaanthracene chloride, M.P. 127–131° (dec.), crystallized from solution in 80% yield. (The corresponding tetrafluoroborate was prepared by the same method as was used in Example 1.

Example 3.—Preparation of 6-diazo-7-methyl-5-oxo-4a-azoniaanthracene tertafluoroborate The title compound was prepared from 5,6-dihydroxy-7-methyl-4a-azoniaanthracene bromide by the same method as that employed in Examples 1 and 2.

Example 4.—Preparation of 4-diazo-7-oxo-5a-azonianaphthacene tetrafluoroborate 7,8-dihydroxy-5a-azonianaphthacene bromide, prepared from 3-bromomethylcatechol diacetate and 3-(1,3-dioxolan-2-yl) isoquinoline, was converted into the title compound by the same method used in the above examples.

Example 5.—Preparation of 8,8′-methylenebis(6-diazo-5-oxo-4a-azoniaanthracene tetrafluoroborate)

A solution of 5,6-dihydroxy-4a-azoniaanthracene bromide (18.7 g., 0.06 mole) and N-isobutoxymethylpiperidine (10 g., 0.04 mole) in 200 ml. of aqueous 50% acetic acid was heated at 80° C. for five minutes, diluted with 150 ml. of water and then refrigerated for one hour at −5° C. The resulting red crystals (13.8 g.) were collected, washed with water, and oxidized with 50% nitric acid to 8,8′-methylenebis(5,6-dioxo-4a-azoniaanthracene nitrate). The latter was then treated with p-toluenesulfonylhydrazide, in the presence of hydrogen chloride, and then with fluoroboric acid in the manner described in Example 1 to obtain 9.4 g. of the corresponding diazo ketone.

This example (5) illustrates the preparation of an azonia diazo ketone of our invention corresponding to Formula 1, when $n=2$.

Example 6.—Negative working, binder-free lithographic plates (A) A grained aluminum plate was whirl-coated with a 1% solution of 6-diazo-5-oxo-8-phenyl-4a-azoniaanthracene tetrafluoroborate in acetonitrile. The bright orange coating was exposed through a standard line and half-tone negative to an arc lamp for 1 minute to obtain a violet, water insoluble, printout image. The positive image obtained after development in hot, running water was treated with an acidic gum-free etch and a lacquer developer to build up the image and improve its ink receptivity. The plate was then run on an off-set printing press and 270 copies were run off. The final copy indicated some loss of dot structure in the "toe" region of the step tablet.

(B) A one-percent solution of 8,8′-methylenebis(6-diazo-5-oxo-4a-azoniaanthracene tetrafluoroborate) in nitromethane was whirl-coated on a grained aluminum plate and dried at 40° C. The resulting coating was exposed through a standard line and half-tone negative to a mercury arc for five minutes. After development in hot water. the plate was treated with an acidic gum-free etch followed by a lacquer-developer and then inked. An excellent positive plate resulted which was run on an offset press to produce 1000 copies with no image degradation noted.

Example 7.—Negative working plates containing polymeric binders (A) A granted aluminum plate was flow coated with a solution of 0.66% of 8,8′-methylenebis(6-diazo-5-oxo-4a-azoniaanthracene tetrafluoroborate) and 0.5% of an alkali soluble terpene phenolic resin (Novolac SP553, Schenectady Chemical Co.) in 1:1 dimethylformamide-cyclohexanone and dried at 40° C. The resulting plate was exposed to a carbon arc for 30 units of exposure through a standard line and half-tone negative, developed in pH 9 aqueous trisodium phosphate, treated with an acidic gum-free etch and then with a plate lacquer and then inked to produce an excellent positive lithographic plate.

The photographic speed of the presensitized plate of this example was considerably higher than comparable commercially available presensitized plates.

(B) A solution of 2-parts by weight of 6-diazo-5-oxo-8-phenyl-4a-azoniaanthracene tetrafluoroborate, 1 part by weight of cellulose acetate hydrogen phthalate, and 97 parts by weight of cyclohexanone was whirl-coated on a grained aluminum plate and allowed to dry. The resulting photographic element was exposed for 5 minutes through a negative pattern to a General Electric RS sunlamp at a distance of 10 inches, developed in 5% aqueous trisodium phosphate for 2 minutes, rinsed with water, treated with an acidic desensitizing etch and then with a lithographic ink to obtain a positive, inked image suitable for lithography.

Example 8.—Preparation of print-out images and their stabilization (A) A one percent solution of 6-diazo-5-oxo-8-phenyl-4a-azoniaanthracene tetrafluoroborate in acetonitrile containing 0.1% of a surface active coating aid was bead-coated on baryta coated, gelatin sized paper. The dried coating was exposed in an Ozalide diazo copier at 3–15 ft./minute using line, half-tone and continuous tone negative transparencies to obtain violet print-out images. The resulting prints were stabilized by washing out the yellow-orange, unexposed diazo ketone in warm water.

A wedge spectrogram indicated a spectral sensitivity to wavelengths of light ranging from 280–510 mμ.

(B) A two percent solution of 6-diazo-5-oxo-8-phenyl-4a-azoniaanthracene tetrafluoroborate in 1:4 2-ethoxyethanolacetonitrile was imbided into or coated upon cloth, ceramics, rubber aluminum, copper, polyethylene terephthalate, and polyethylene coated paper. Exposures of these coated materials through negative patterns to a General Electric RS sunlamp at a distance of 10 inches for from 2–10 minutes gave violet print-out images which were fixed by washing in water. Similar coatings of the diazo ketone in various polymeric vehicles also gave print-out images but of lower densities, insolubilization of the polymers in the exposed areas occurring in most cases.

(C) A one percent solution of 8,8′-methylenebis(6-diazo-5-oxo-4a-azoniaanthracene tetrafluoroborate) in a mixture of nitromethane and cyclohexanone was coated on baryta coated, gelatin sized paper and also on cloth. The resulting coatings were exposed through line and half tone patterns in an Ozalid copier at speeds of from 2–10 ft./minute to obtain deep bluish-gray print-out images which were more dense than corresponding images obtained from coatings of 6-diazo-5-oxo-8-phenyl-4a-azonia-anthracene tetrafluoroborate. The resulting prints were stabilized by washing with water except in those cases where penetration of the support material had occurred in which case soaking in dilute aqueous acid was more effective.

Example 9.—Preparation of a presensitized lithographic printing plate capable of producing a print-out image The following formulations were prepared:

Formulation A: 1.0 gram light sensitive polycarbonate plus 100 cc. monochlorobenzene The light sensitive polycarbonate has the following recurring 20 groups:

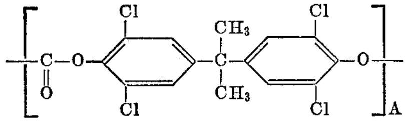

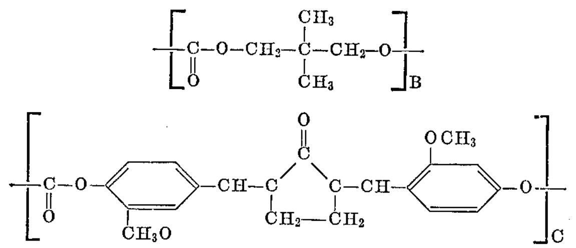

in a molar proportion of: 28% C; 22% A; and 50% B.

Formulation B: 0.25 gram azonia diazo ketone plus 100 cc. acetone

The azonia diazo ketone has the structural formula given below:

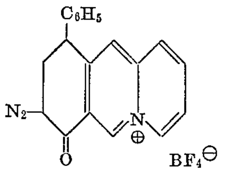

Formulations A and B were mixed and flow-coated on a paper plate and dried in a near-vertical position for 30 minutes at 40° C. The plate was exposed imagewise to a 95-amp arc at a distance of 5 feet for one minute.

A violet colored print-out image was obtained (observed under gold fluorescent lights). The plate was swab-developed with benzyl alcohol, with subsequent swabbing with water in order to remove the excess alcohol. An olive-colored image remained. A press run of 5000 impressions was made using a lithographic printing press. There was little or no image loss.

The intensity of the print-out image varies with the exposure time and with the concentration of the azonia diazo ketone.

Example 10.—Positive working resist

Into 4.5 ml. of 4-butyrolactone was placed 0.18 g. of 8-phenyl-6-diazo-5-oxo-4a-azoniaanthracene fluoroborate. When this was dissolved, 8 ml. of 2-ethoxyethanol and 2.16 g. of a cresol formaldehyde resin product of Chemische Werks, Germany, marketed in the United States by American Hoechst Corp. as Alnovol 429 K, were added, and the mixture was agitated. (Ratio of azonia diazo ketone to resin 1:12). The solution was filtered, coated on a clean copper surface, air dried, and baked 10 minutes at 60° C. The resist was exposed 5 minutes through a pattern to a carbon arc source at an intensity level of 2000 foot-candles. The copper plate was immersed in an aqueous solution of trisodium phosphate (18% concentration) for two minutes to remove the exposed portion. The resist was rinsed with water, dried with an air jet, and postbaked 5 minutes at 60° C. The copper was then etched in 42° $FeCl_3$ satisfactorily, whereas the resist covered areas were protected.

Example 11.—Solubility effects

The solubility of 8,8′-methylenebis(6-diazo-5-oxo-4a-azoniaanthracene fluoroborate) was such that 0.18 gram did not dissolve in 3 ml. of 4-butyrolactone. However, when the same azonia diazo ketone was used except as the tetraphenyl boride, the solubility was adequate and resist coatings were made as in Example 10.

Example 12.—Repeat of Example 10, using different phenolic resin

A commercial phenol-formaldehyde polymer based on p-phenyl phenol sold by Union Carbide and Carbon Corp., New York as Bakelite CKM 5254 was used. The amounts and solvents were the same as in Example 10. The exposed image could not be developed in 24% $Na_3PO_4$. The developer solution was modified by adding solvent (2-ethoxyethanol) to the alkaline $Na_3PO_4$ solution. Results were as follows:

| Ratio of HOH to 2-ethoxyethanol | Percent $NA_3PO_4$ in water | Image removal |
|---|---|---|
| 100 | 24 | Not removed. |
| 90:10 | 18 | Do. |
| 85:15 | 9 | Could be swab developed. |

Example 13.—Repeat of Example 10 at higher ratio of Alnovol

The resist formulation prepared was the same as Example 10 except 2.88 g. of Alnovol 429 K was used in place of 2.16 g. Weight ratio of azonia diazo ketone to resin—1:16. After exposure, development was carried out satisfactorily but there was less latitude than in Example 10. (By less latitude, we mean the difference in solubility between the exposed and unexposed areas was less so that it was more difficult to obtain removal of exposed areas without also removing the background areas.)

Example 14.—Repeat of Example 10 at lower ratio of resin to azonia diazo ketone

The formulation was the same as Example 10 except that 0.2 g. of diazo ketone and 1.0 g. of Alnovol were used. Weight ratio azonia diazo ketone to resin equals 1:5. The exposed image in such a coating could not be developed in 18% $Na_3PO_4$, but a more alkaline solution, 1.25% sodium hydroxide could be used to produce a satisfactory resist pattern.

It will be seen that as the proportion of azonia diazo ketone increases relative to the polymer, more alkaline developer is required to develop the image.

Example 15.—Addition of a film-forming polymer

To a formulation as used in Example 10 was added 0.1 g. of a high molecular weight polyvinylacetate. (Polystyrene and polyvinyl butyrals have been used equally well). The presence of such film formers tends to reinforce the phenolic polymer in decreasing the permeability of the residual film to the etchant. A resist coating prepared as above could be swab-developed to remove the softened film in the exposed areas using an 18% aqueous solution of trisodium phosphate. After such removal and drying, successful etching could be carried out.

Example 16.—Positive working resist

A formulation was prepared to contain:

8-tert.-butyl - 6 - diazo-5-oxo-4a-azoniaanthracene fluoroborate—.24 g.
4-butyrolactone—2.0 ml.
2-ethoxyethanol—10.5 ml.
Alnovol 429K—1.2 g.

It was stirred to effect complete solution, filtered to remove particulate matter, coated on a copper plate and dried. The thickness of the dry coating was 0.15 mil. After baking at 60° for 10 minutes, the plate was exposed to a carbon arc (for 3 minutes at 2000 foot-candles) through a high contrast image pattern. An image was observed. It was processed in a 1.25% sodium hydroxide solution for about 2 minutes (to remove the exposed areas), flushed with water, and air dried. It was post-baked for 5 minutes at 60° C. Etching to a depth of several thousandths of an inch was carried out in ferric chloride without any stripping of the resist.

The invention has been described in detail with particular reference to preferred embodiments thereof, but it will be understood that variations and modifications can be effected within the spirit and scope of the invention as described hereinabove.

We claim:

1. An azonia diazo ketone having the formula:

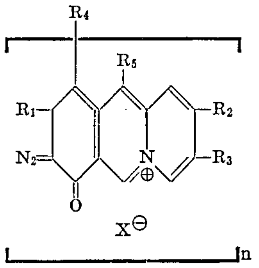

wherein $X^{\ominus}$ represents an anion;
$n$ is a whole integer of 1 or 2;
$R_1$ is hydrogen or alkyl of 1 to 8 carbon atoms;
$R_2$ and $R_3$ are each hydrogen or together represent the atoms necessary to complete a fused phenylene ring;
$R_5$ is hydrogen;
when $n$ is 1, $R_4$ is hydrogen, alkyl of 1 to 8 carbon atoms or phenyl and when $n$ is 2, $R_4$ is alkylene of 1 to 4 carbon atoms.

2. An azonia diazo ketone of claim 1 wherein
$X^{\ominus}$ represents an anion;
$n$ is 1;
$R_1$, $R_2$, $R_3$ and $R_5$ are each hydrogen; and
$R_4$ is alkyl of 1 to 8 carbon atoms or phenyl.

3. 8-tert-butyl - 6 - diazo - 5 - oxo-4a-azoniaanthracene chloride.

4. 8-tert-butyl - 6 - diazo - 5 - oxo-4a-azoniaanthracene tetrafluoroborate.

5. 6 - diazo - 5 - oxo - 8 - phenyl - 4a - azoniaanthracene tetrafluoroborate.

6. 6-diazo - 7 - methyl-5-oxo-4a-azoniaanthracene tetrafluoroborate.

7. 8-diazo - 7 - oxo-5a-azonianaphthacene tetrafluoroborate.

8. 8,8′ - methylenebis(6 - diazo - 5 - oxo - 4a - azoniaanthracene tetrafluoroborate.

References Cited

UNITED STATES PATENTS

| | | | |
|---|---|---|---|
| 2,859,112 | 11/1958 | Sus et al. | 260—141 XR |
| 2,971,842 | 2/1961 | Moore et al. | 260—141 XR |
| 3,046,124 | 7/1962 | Schmidt | 260—141 XR |

FLOYD D. HIGEL, Primary Examiner

U.S. Cl. X.R.

96—75; 260—269, 295 R, 463, 479 S